United States Patent [19]
Hara et al.

[11] Patent Number: 5,970,369
[45] Date of Patent: Oct. 19, 1999

[54] SEMICONDUCTOR DEVICE WITH POLYSILICON LAYER OF GOOD CRYSTALLINITY AND ITS MANUFACTURE METHOD

[75] Inventors: Akito Hara; Satoshi Murakami; Kuninori Kitahara, all of Kawasaki, Japan

[73] Assignee: Fujitsu Limited, Kawasaki, Japan

[21] Appl. No.: 08/976,012

[22] Filed: Nov. 21, 1997

[30] Foreign Application Priority Data

May 20, 1997 [JP] Japan .................................... 9-130130
Sep. 4, 1997 [JP] Japan .................................... 9-239753

[51] Int. Cl.[6] .................................................. H01L 21/20
[52] U.S. Cl. ......................... 438/488; 438/149; 438/166; 438/97
[58] Field of Search .................................. 438/488, 149, 438/166; 257/755

[56] References Cited

U.S. PATENT DOCUMENTS

| 4,375,993 | 3/1983 | Mori et al. | 438/488 |
| 5,444,302 | 8/1995 | Nakajima et al. | 257/755 |
| 5,766,803 | 7/1998 | Young | 438/149 |
| 5,766,989 | 6/1998 | Maegawa et al. | 438/166 |
| 5,797,999 | 8/1998 | Sannomiya et al. | 438/97 |
| 5,827,773 | 10/1998 | Voutsas | 438/488 |

OTHER PUBLICATIONS

The Japan Society of Applied Physics, pp. 59–62, Sep. 11–12, 1997.

Primary Examiner—Peter Toby Brown
Assistant Examiner—Khanh Duong
Attorney, Agent, or Firm—Armstrong, Westerman, Hattori, McLeland & Naughton

[57] ABSTRACT

A multilayer polysilicon semiconductor device having a first layer of amorphous semiconductor deposited on the surface of an underlying substrate. The first layer is polycrystallized by applying an energy beam to the first layer. A second layer is deposited on the surface of the polycrystallized first layer, the second layer being made of amorphous semiconductor having the same composition as the first layer or polycrystalline semiconductor. Crystallinity of the second layer is changed by applying an energy beam to the second layer. The substrate may be heated when the energy beam is applied to the second layer.

6 Claims, 16 Drawing Sheets

SEMICONDUCTOR DEVICE WITH POLYSILICON LAYER OF GOOD CRYSTALLINITY AND ITS MANUFACTURE METHOD

This application is based on Japanese Patent Application No. Hei 9-130130 filed on May 20, 1997 and No. Hei 9-239753 filed on Sep. 4, 1997, the entire contents of which are incorporated herein by reference. The inventors also reported """"New Approach to Form poly-Si by Low, Wide Energy Range of Laser Irradiation""""", A. Hara et al., Active-Matrix Liquid-Crystal Displays (The Japan Society of Applied Physics), Sep. 11–12, 1997, pp. 59–62, which is incorporated herein by reference.

BACKGROUND OF THE INVENTION

1. Field of the Invention

The present invention generally relates to a semiconductor device and its manufacture method, and specifically to a semiconductor device with a polycrystalline semiconductor layer and a method of forming a polycrystalline semiconductor layer. Polycrystalline semiconductor layers are used in liquid crystal displays, solar batteries, and the like.

2. Description of the Related Art

A conventional technique of forming a polycrystalline semiconductor layer will be described by taking as an example, a method of forming a polysilicon layer on a glass substrate.

It is known to polycrystallize a thin film of amorphous silicon deposited on a glass substrate by performing heat treatment at about 600° C. Since this method requires heat treatment at about 600° C., the glass substrate may be deformed with heat. Crystal grains in the polycrystallized silicon thin film contain many stacking faults and twins so that it is difficult to form a film having good crystallinity.

Another known technique is to melt an amorphous silicon thin film by applying an energy beam, such as a laser beam, and polycrystallize it while it is cooled. This method requires a high density of laser energy in order to obtain polycrystals of high quality. However, if the laser intensity is too strong, it is difficult to obtain a polycrystalline film uniform in quality because of an unstable operation of a laser source system or other reasons.

Chemical vapor deposition (CVD) may also be used for the formation of a polycrystalline silicon film. Also in this method, a growth temperature of 600° C. or higher is necessary which may cause deformation of a glass substrate. With this method, it is also difficult to obtain a silicon film good in crystallinity.

As above, conventional techniques are difficult to form a polycrystalline semiconductor layer good in crystallinity, on a glass substrate, for example.

SUMMARY OF THE INVENTION

It is an object of the present invention to provide a method of manufacturing a semiconductor device capable of forming a polycrystalline semiconductor layer good in crystallinity.

It is an object of the present invention to provide a semiconductor device with a polycrystalline semiconductor layer good in crystallinity.

According to one aspect of the present invention, there is provided a method of manufacturing a semiconductor device comprising the steps of: depositing a first layer on a surface of an underlying substrate, the first layer being made of amorphous semiconductor; polycrystallizing the first layer by applying an energy beam to the first layer; depositing a second layer on a surface of the polycrystallized first layer, the second layer being made of amorphous semiconductor having the same composition as the first layer or polycrystalline semiconductor; and changing crystallinity of the second layer by applying an energy beam to the second layer.

If deposition and energy beam exposure are performed a plurality of times, a layer deposited at the second or succeeding deposition process is influenced by the underlying crystalline layer while the layer is exposed to an energy beam and polycrystallized. As compared to polycrystallizing an amorphous layer having a desired thickness by a single energy beam exposure process, this method can form a good quality polycrystalline layer at a relatively low energy density of the energy beam.

According to another aspect of the present invention, there is provided a semiconductor device comprising: an underlying substrate with an insulating surface; and a polycrystalline lamination structure including at least two polycrystalline semiconductor layers formed on the insulating surface of the underlying substrate, the semiconductor layers having the same composition of polycrystals, and grain boundaries of one of two adjacent semiconductor layers and grain boundaries of the other semiconductor layer being discontinuous at an interface between the two adjacent semiconductor layers.

Since the grain boundaries of adjacent two semiconductor layers are discontinuous, the upper and lower gain boundaries contact one another at the interface between the two layers. Current flows through grains by traversing the interface. Accordingly, current flows in the in-plane direction without traversing the gain boundaries in the same layer.

According to a further aspect of the present invention, there is provided a semiconductor device comprising: an underlying substrate with an insulating surface; and a polycrystalline lamination structure including at least two polycrystalline semiconductor layers formed on the insulating surface of the underlying substrate, the semiconductor layers having the same composition of polycrystals, and a density distribution of atmospheric air composition having a peak at an interface between two adjacent semiconductor layers.

If each semiconductor layer is deposited and thereafter applied with an energy beam to polycrystallize it while the surface of the layer is exposed to atmospheric air, a peak of the density distribution of atmospheric air composition appears at the interface of two adjacent semiconductor layers.

According to a still further aspect of the present invention, there is provided a semiconductor device comprising: an underlying substrate with an insulating surface; and a polycrystalline semiconductor layer formed on the insulating surface of the underlying substrate, the polycrystalline semiconductor layer having a peak of a density distribution of atmospheric air composition at some depth from a surface of the polycrystalline semiconductor layer.

While deposition of a semiconductor layer and application of an energy beam are repetitively performed, the surface of a newly deposited semiconductor layer is exposed to atmospheric air and absorbs atmospheric air composition until the next semiconductor layer is deposited. Therefore, a peak in the density distribution of atmospheric air composition appears at some depth from the surface of the next deposited semiconductor layer. If only the lowest level semiconductor layer is imperfectly melted and the other semiconductor layers are perfectly melted by applying an energy beam, discontinuity of crystal structures is not formed at each interface between adjacent semiconductor layers, and only a single crystal grain is grown in the depth direction of each semiconductor layer. A peak of atmospheric air composition appears at some depths from the surface which correspond to interfaces of two adjacent semiconductor layers as they have been deposited.

As described above, a polycrystalline silicon layer good in crystallinity and electrical characteristics can be formed by repeating several times the deposition of an amorphous silicon layer and the polycrystallization through laser radiation.

DETAILED DESCRIPTION OF THE PREFERRED EMBODIMENTS

With reference to FIGS. 1A to 1D, a description will be given for a method of forming a polysilicon layer according to an embodiment of the invention.

Figure 1A:
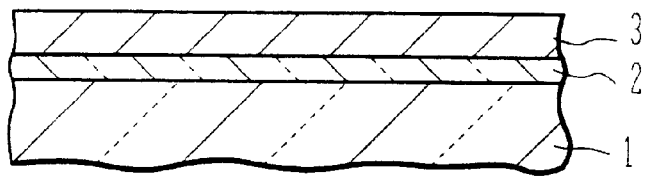
FIGS. 1A to 1D are cross-sectional views showing a substrate and a lamination structure, illustrating a method of forming a polysilicon layer according to a first embodiment of the invention.

As shown in FIG. 1A, an $SiO_2$ film 2 is deposited on the surface of a glass substrate by CVD or other methods. On the surface of the $SiO_2$ film, a first-level silicon layer 3 of amorphous silicon is deposited to a thickness of 20 nm. This deposition is performed by plasma enhanced CVD (PE-CVD) using $SiH_4$ and $H_2$ as source gas. The deposition conditions are, for example, a substrate temperature of 300° C., flow rates of $SiH_4$ and $H_2$ of 200 sccm and 800 sccm and a power of 0.1 W/cm$^2$. After the first-level silicon layer 3 is deposited, the substrate is heated to 450° C. in a nitrogen atmosphere to perform heat treatment for 3 hours. This heat treatment is performed to remove hydrogen contained in the silicon layer 3.

Figure 1B:
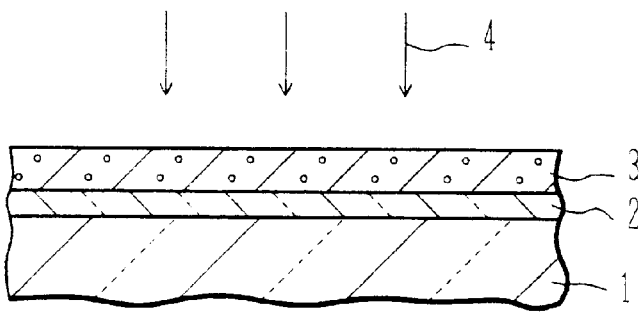

As shown in FIG. 1B, a laser beam 4 is applied to the silicon layer 3. This laser may be xenon chloride (XeCl) excimer laser having a wavelength of 308 nm, an energy density of about 300 mJ/cm$^2$, a pulse repetition frequency of 100 Hz, and an exposure time of 30 ns per pulse. The laser exposure region is an elongated area with a width of 1 mm and a length of 100 mm. This exposure region is moved by 0.05 mm per pulse in the width direction to cover a wide laser exposure area. This laser exposure polycrystallizes the silicon layer 3. If the silicon layer 3 has a thickness on the order of 20 nm described above, only one grain is generally formed in the thickness direction of the silicon layer 3.

Figure 1C:
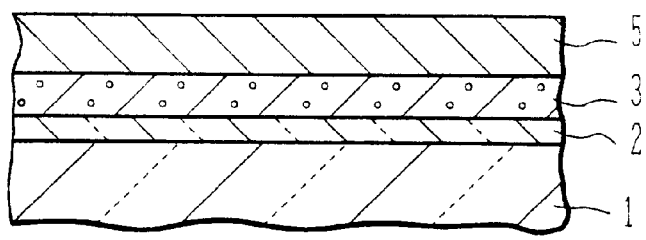

As shown in FIG. 1C, on the surface of the silicon layer 3, a second-level silicon layer 5 of amorphous silicon is deposited to a thickness of 30 nm. The deposition conditions are the same as the first-level silicon layer 3. After the silicon layer 5 is deposited, the substrate is heated to 450° C. in a nitrogen atmosphere to perform heat treatment for 3 hours.

Figure 1D:
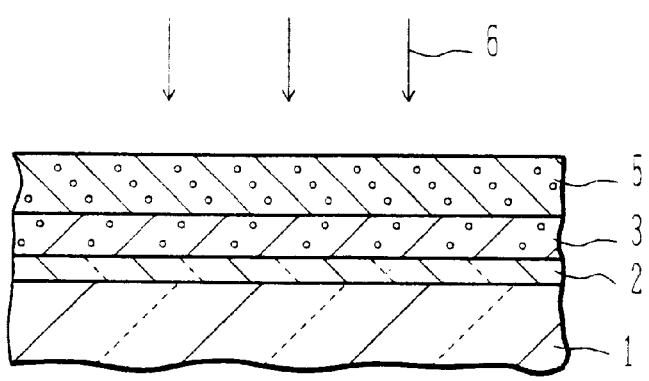

As shown in FIG. 1D, a laser beam 6 is applied to the second-level silicon layer 5. The radiation method is similar to the case wherein the laser beam 4 is applied to the first-level silicon layer 3 shown in FIG. 1B, and the energy densities are set to 265, 295, and 335 mJ/cm$^2$. This laser radiation polycrystallizes the silicon layer 5. In the above manner, the processes of depositing an amorphous silicon layer and applying a laser beam to crystallize it are repeated. The repetition frequency may be three or more.

In the above embodiment, a laser beam is applied to a silicon layer. A different energy beam may also be applied. For example, an electron beam, an infrared beam or the like may be used.

Crystallinity and electrical characteristics of the silicon layers 3 and 5 formed by the above method were evaluated by Raman scattering, mobility measured by the Hall effect (hereinafter called Hall mobility), and off-current and field effect mobility of MOS transistors.

Figure 2A:
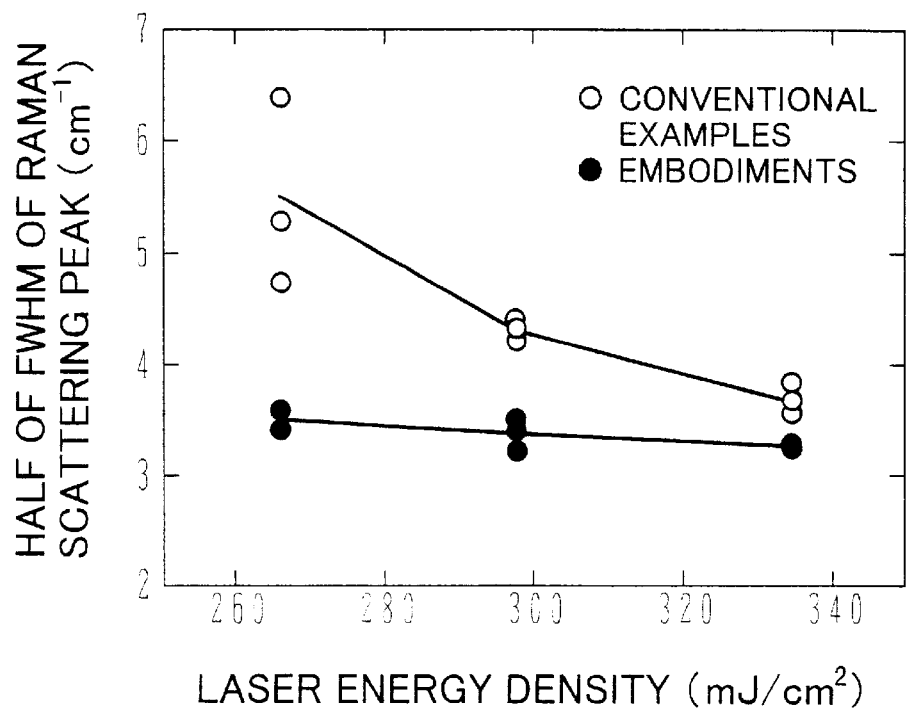
FIGS. 2A and 2B are graphs showing a half of FWHM (full width of half maximum) width of a Raman scattering peak and a Hall mobility of a silicon layer formed by the embodiment method, as a function of an energy density of radiated laser.

FIG. 2A is a graph showing a half of FWHM of a Raman scattering peak, as a function of an energy density of a laser beam applied to the second-level silicon layer 5. The abscissa represents an energy density in the unit of mJ/cm$^2$, and the ordinate represents a half of FWHM in the unit of cm$^{-1}$. The half of FWHM means a half of the peak width at a half height of the peak. A solid circle symbol in FIG. 2A indicates a measured value of a silicon layer formed by the embodiment method of FIG. 1A to 1D. A circle symbol in FIG. 2A indicates a measured value of a silicon layer formed by conventional techniques in which an amorphous silicon layer is deposited to a thickness of 50 nm by a single deposition process and the layer is polycrystallized by a single laser exposure process.

A half of FWHM of the silicon layer formed by the embodiment method is smaller than that of the silicon layer formed by conventional techniques. This indicates that the silicon layer formed by the embodiment method has better crystallinity.

Figure 2B:
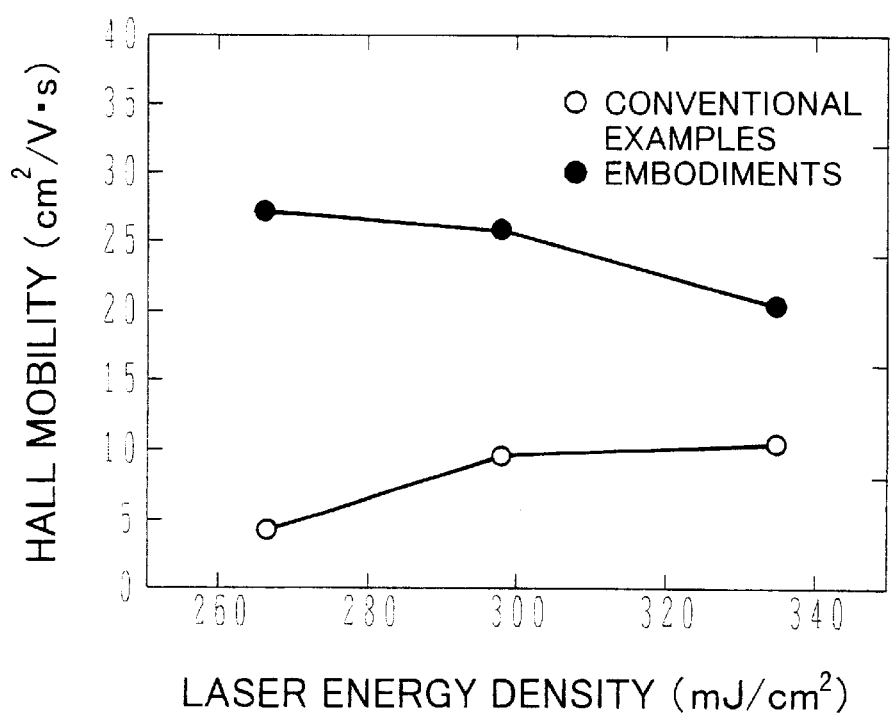

FIG. 2B shows a Hall mobility (a mobility measured by the Hall effect) as a function of the energy density of a laser beam applied to the second-level silicon layer 5. Samples measured were prepared by ion-doping phosphorous in the silicon layers 3 and 5 shown in FIG. 1D and thereafter exposing them in hydrogen plasma. Phosphorous ion-doping was performed at an acceleration energy of 10 keV and a dose of $5 \times 10^{13}$ cm$^{-2}$ by using gas plasma of $PH_3$ and $H_2$ with a mixture ratio of 5:95. After the ion-doping, the substrate was annealed at 600° C. for 2minutes. Exposure in the hydrogen plasma is to terminate dangling bonds in grain boundary and in-grain defect with hydrogen atoms.

As shown in FIG. 2B, the silicon layer formed by the embodiment method has a higher mobility than that formed by conventional techniques.

As seen from FIGS. 2A and 2B, the half of FWHM and mobility are considerably improved particularly at a laser energy density less than 280 mJ/cm$^2$. The formation of a good polysilicon film even with a low energy density may be ascribed to the influence of the underlying polysilicon layer while the second and succeeding polycrystallization processes are performed by laser exposure.

The embodiment method can provide a high quality polysilicon layer even at a relatively low energy density of applied laser. Therefore, a broader region can be exposed at the same time without increasing the laser intensity.

Figure 3A:
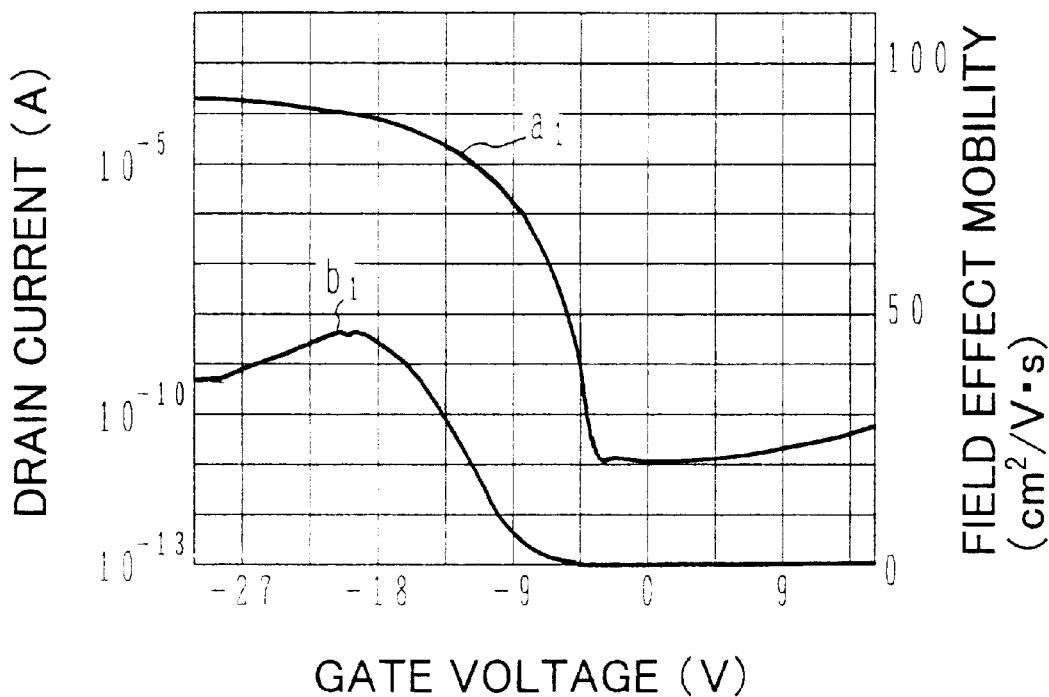
FIG. 3A is a graph showing drain current characteristics and a mobility of a TFT with a polysilicon layer formed by the embodiment method.
Figure 3B:
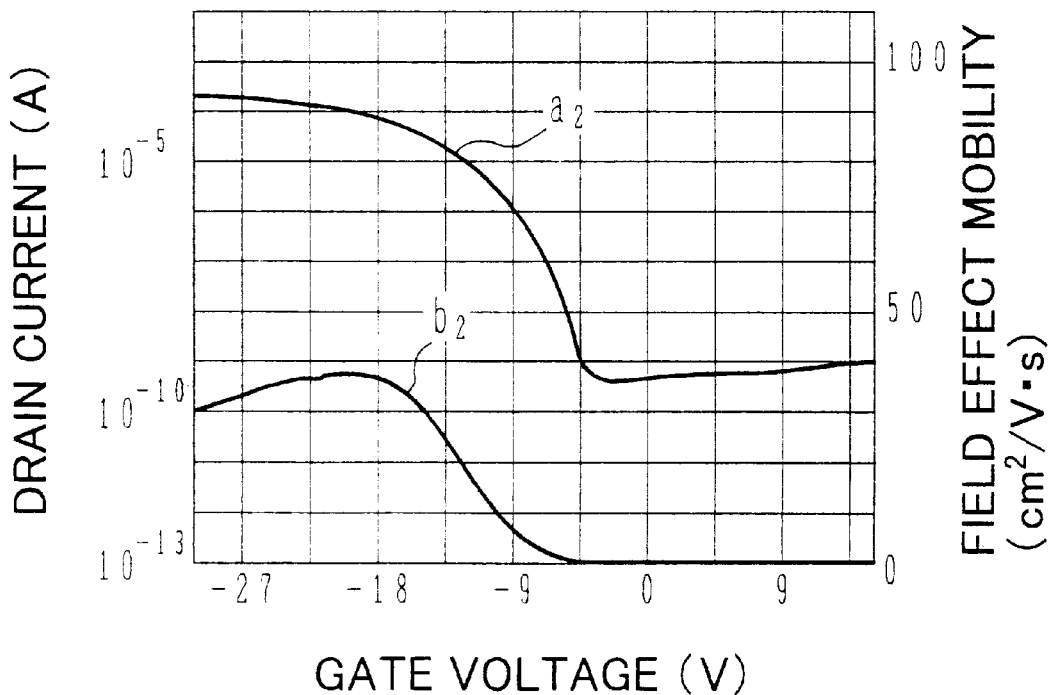
FIG. 3B is a graph showing drain current characteristics and a mobility of a TFT with a polysilicon layer formed by conventional techniques.

FIG. 3A shows the drain current characteristics and field effect mobility of a thin film transistor (TFT) using the silicon layers 3 and 5 formed by the embodiment method. For the comparison, the drain current characteristics and field effect mobility of a TFT formed by conventional techniques are shown in FIG. 3B. Curves $a_1$ and $a_2$ show the drain current, and curves $b_1$ and $b_2$ show the carrier mobility.

These sample TFTs are p-channel MOSFETs having gate length of 10 $\mu$m, a gate width of 10 $\mu$m, and a gate insulating film thickness of 120 nm.

As seen from FIG. 3A, an off-current of TFT formed by the embodiment method is about $1 \times 10^{-11}$ A and the field effect mobility is about 48 cm$^2$/V·s. As seen from FIG. 3B, an off-current of TFT formed by conventional techniques is about $1 \times 10^{-9}$ A and the field effect mobility is about 38 cm$^2$/V·s. The TFT off-current of the embodiment is about $\frac{1}{100}$ that of the conventional TFT, and the field effect mobility of the embodiment is also high.

The graphs of FIGS. 2A to 3B compare the embodiment method shown in FIGS. 1A to 1D with a conventional method with a single process of depositing an amorphous silicon layer and a single process of applying a laser beam. Next, the silicon layer formed by the embodiment method will be compared with a silicon layer formed by another method. Although this other method also performs a film deposition process and a laser exposure process twice, an amorphous silicon layer is not polycrystallized but a polysilicon layer with 45 nm thick is deposited at the initial stage and applied with a laser beam.

Figure 4:
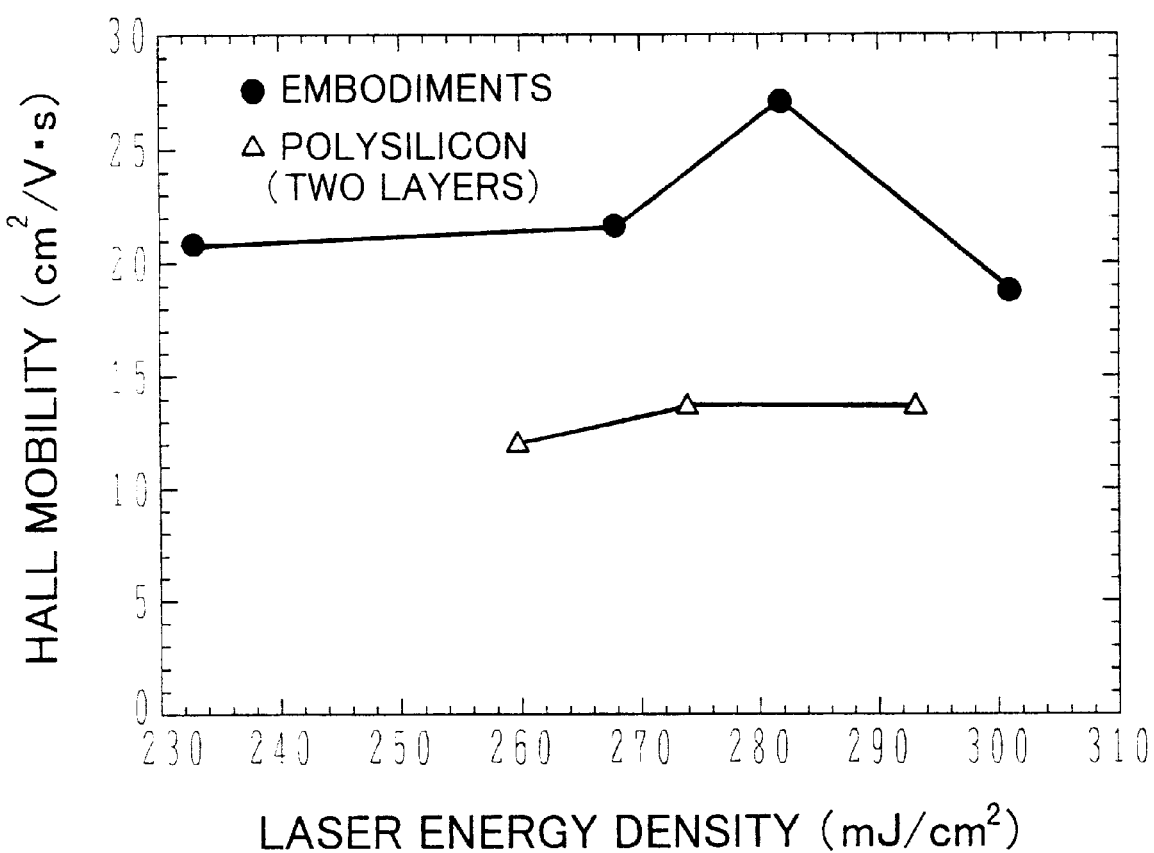
FIG. 4 is a graph showing a Hall mobility of a silicon layer formed with the embodiment method, compared with a Hall mobility of a silicon layer formed by conventional techniques.

FIG. 4 shows a Hall mobility of a silicon layer as the function of an energy density of laser applied at the second exposure process. The abscissa represents an energy density of laser in the unit of mJ/cm$^2$ and the ordinate represents a Hall mobility in the unit of cm$^2$/V·s. A solid circle symbol in FIG. 4 shows a Hall mobility of a silicon layer formed by the embodiment method, and a triangle symbol shows a Hall mobility of a silicon layer formed by the other method. The total thickness of silicon layers is both 45 nm.

As seen from FIG. 4, the silicon layer formed by the embodiment method has a higher mobility. Rather than depositing a polysilicon layer at the initial stage and applying a laser beam, depositing an amorphous silicon layer and thereafter polycrystallizing it can provide a silicon layer having better electrical characteristics.

Amorphous silicon and polysilicon can be discriminated, for example, by the following method. If analysis of X-ray diffraction shows no peak in the (1 0 0), (1 1 0), or other planes, the material is supposed to be amorphous silicon. If analysis of Raman scattering has no peak near at a wave number of 520 cm$^{-1}$ corresponding to polysilicon, the material is supposed to be amorphous silicon. The material includes presumably amorphous silicon as in the above embodiment, if a peak appears near at the wave number of 480 cm$^{-1}$ corresponding to amorphous silicon.

Next, the impurity concentration of a silicon layer in its thickness direction formed by the embodiment method will be described.

Figure 5:
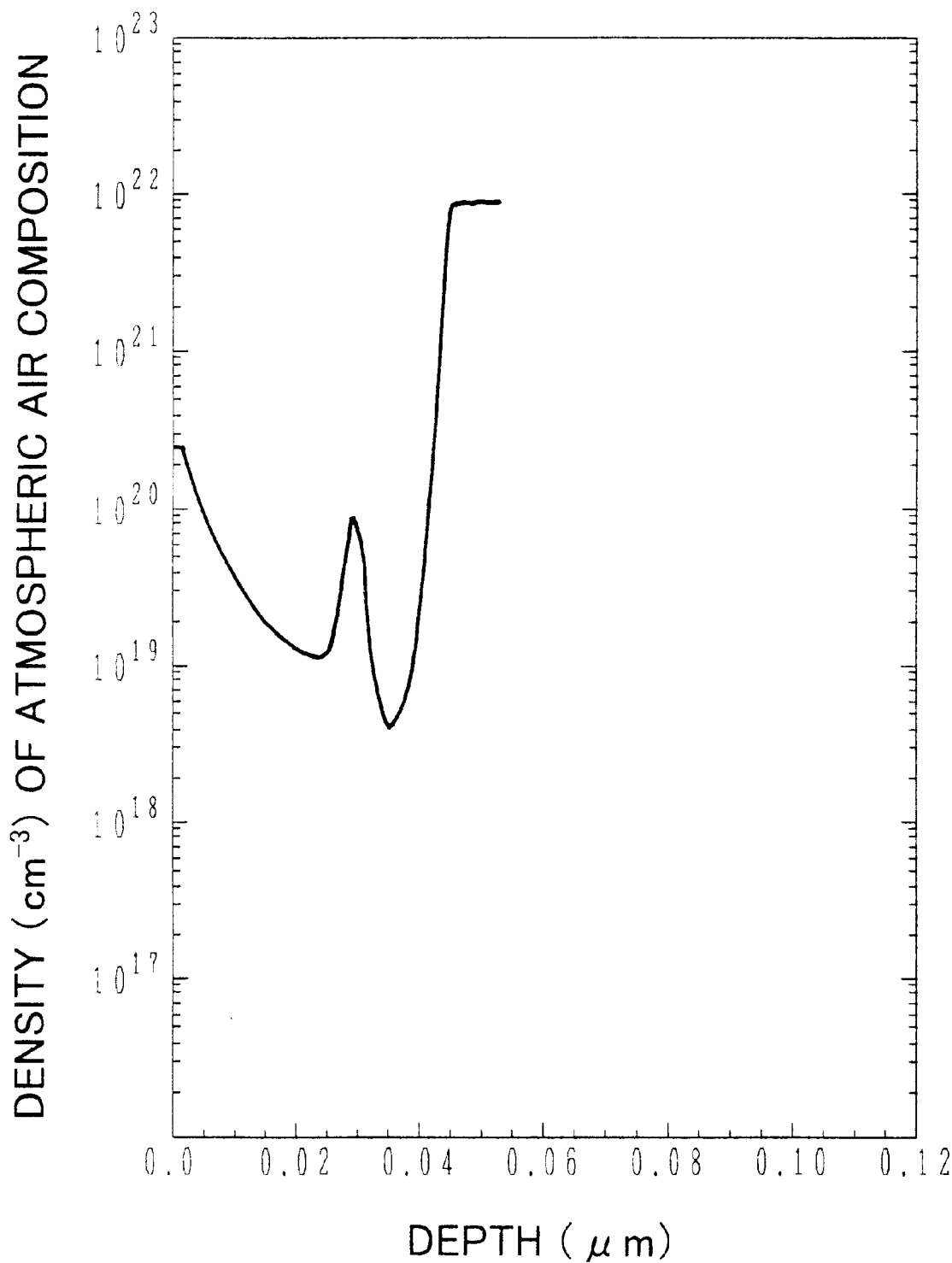
FIG. 5 is a graph showing a density distribution of atmospheric air composition along a thickness direction of a polysilicon layer formed by the embodiment method.

FIG. 5 shows the SIMS analysis results of the silicon layers 3 and 5 at the process stage of the embodiment method shown in FIG. 1C, i.e., at the stage before the second laser beam is applied and after the second-level silicon layer 5 is deposited. The abscissa represents a depth from the surface of the silicon layer 5 in the unit of $\mu$m, and the ordinate represents a density of atmospheric air composition, in this case, oxygen density, in the unit of cm$^{-3}$.

A peak of impurity concentration appears at the depth of 0.03 $\mu$m. This depth corresponds to an interface between the silicon layers 3 and 5 shown in FIG. 1D. The surface of the first-level silicon layer 3 is exposed to atmospheric air during laser exposure before the second-level silicon layer 5 is deposited. A peak in the impurity concentration distribution may be ascribed to the attachment of atmospheric air composition to the surface of the silicon layer 3 exposed to atmospheric air. This peak of impurity concentration did not disappear even after the second silicon layer 5 is polycrystallized by laser exposure.

Next, the reason of excellent electrical characteristics of a silicon layer formed by the embodiment method will be described.

Figure 6:
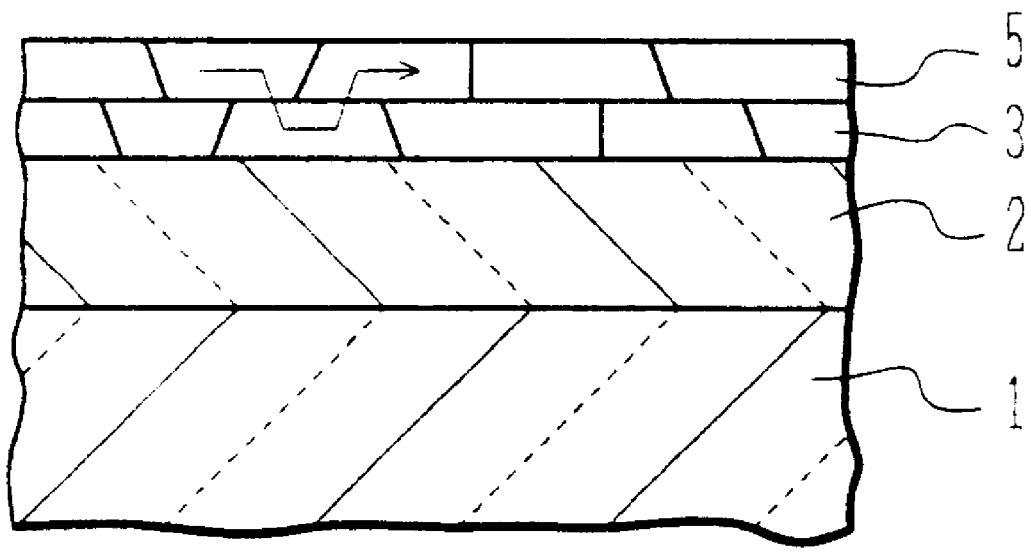
FIG. 6 is a cross sectional view of a silicon layer formed by the embodiment method, specifically showing the distribution of grains.

FIG. 6 is a schematic diagram sketched from a transmission electron microscope photograph of the cross section of a silicon layer formed by the embodiment method. An SiO$_2$ film 2 is formed on a glass substrate 1. On the SiO$_2$ film 2, a first-level polysilicon layer 3 and a second-level polysilicon layer 5 are stacked upon in this order. Grain boundaries of the second-level silicon layer 5 are discontinuous with those of the first-level silicon layer 3.

Therefore, as shown by an arrow in FIG. 6, current can flow along an in-plane direction by passing through the interface between the silicon layers 3 and 5 without traversing the grain boundary in the same layer. An area of the interface between the silicon layers 3 and 5 is much larger than that of the grain boundary in the same layer. It can be therefore expected that current is easy to flow through the silicon layers. In order to take the above effect, it is preferable that 30% or more of grain boundaries of one of two adjacent silicon layers are discontinuous with grain boundaries of the other silicon layer, in some cross section of the silicon layers.

Next, why the discontinuous grain boundaries are formed between the first and second silicon layers will be studied.

Figure 7A:
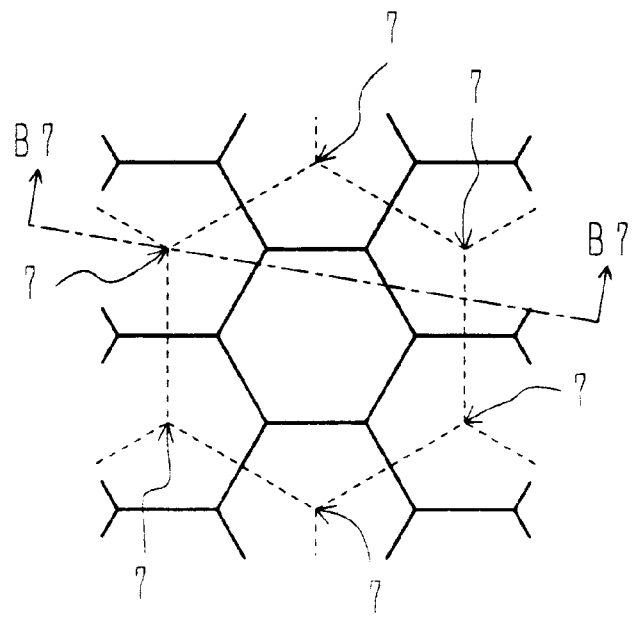
FIGS. 7A and 7B are a plan view and a cross sectional view of a silicon layer formed by the embodiment method, specifically showing the distribution of grains.
Figure 7B:
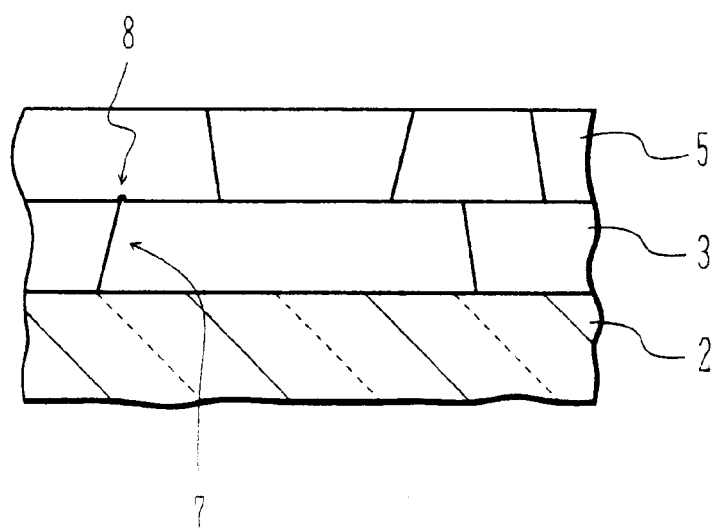

FIG. 7A is a schematic plan view of the silicon layers 3 and 5, and FIG. 7B is a cross sectional view taken along one-dot chain line B7—B7. In FIG. 7A, broken lines indicate grain boundaries of the first-level silicon layer 3, and solid lines indicate grain boundaries of the second-level silicon layer 5. A bulge 8 shown in FIG. 7 is formed at a cross point 7 of at least three grain boundaries on the surface of the first-level silicon layer 3 polycrystallized by laser exposure.

As laser is applied to the second-level silicon layer 5, crystallization progresses by using the bulge 8 as a seed. Therefore, as shown in FIGS. 7A and 7B, the boundaries of the silicon layers 3 and 5 become discontinuous. By using as crystal growth seeds the bulges 8 formed at cross points of the grain boundaries of the first-level silicon layer 3, the two-layered polysilicon layer having discontinuous grain boundaries can be formed.

A rise of the temperature of the first-level silicon layer 3 caused by the laser exposure at the process shown in FIG. 1D gives favorable effects upon the growth of high quality polysilicon.

Another embodiment of the invention will be described next.

In the first embodiment, the second laser beam exposure is performed at the process of FIG. 1D without heating the substrate. In the second embodiment, the substrate is heated while a second laser beam is applied, the other processes being basically the same as the first embodiment described with FIGS. 1A to 1D.

The crystallinity and electrical characteristics of silicon layers 3 and 5 formed by this second embodiment were evaluated from Raman scattering, Hall mobility, and absorption spectrum of ultraviolet reflection (UV reflection). The substrate temperature at the second laser beam exposure at the process of FIG. 1D was set to 250° C. and the energy density was changed in a range of 250 to 360 mJ/cm$^2$. The energy density at the first laser beam exposure at the process of FIG. 1B was set to 280 mJ/cm$^2$.

Figure 8:
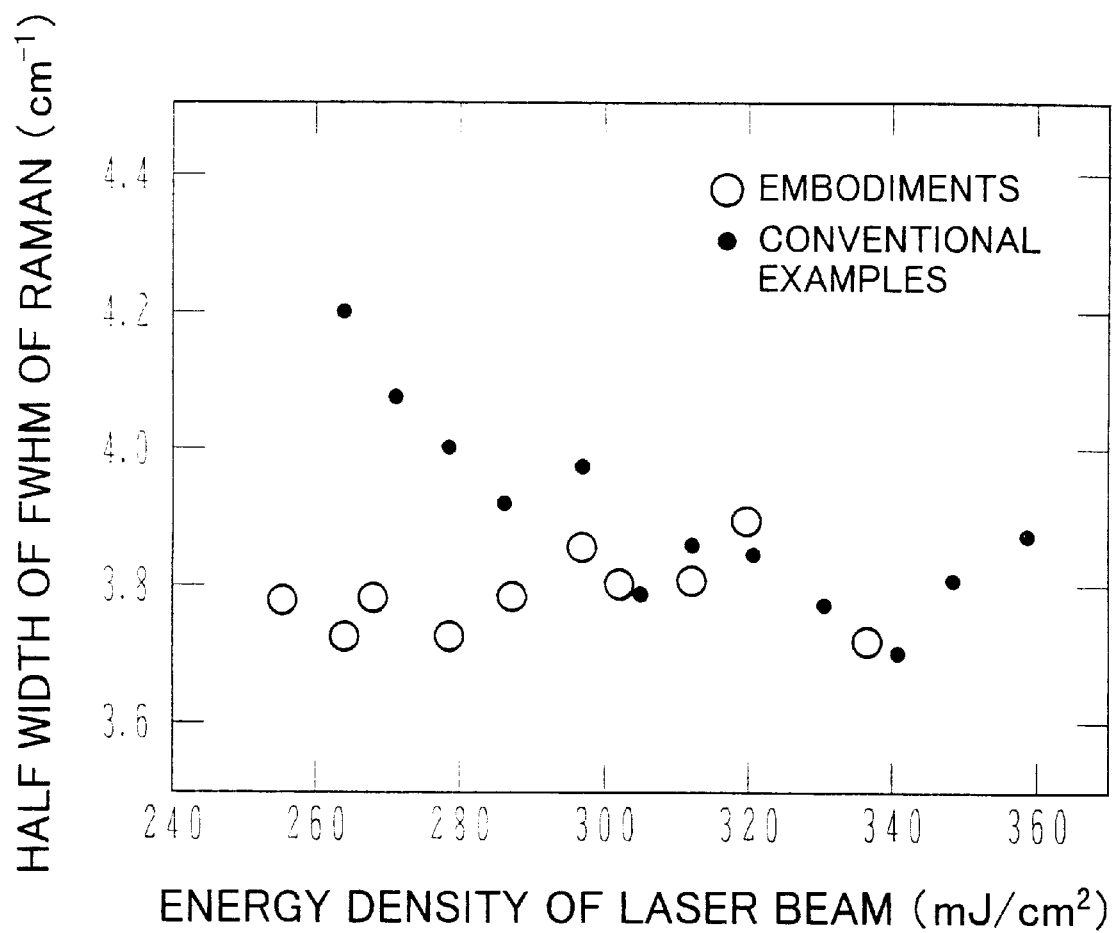
FIG. 8 is a graph showing a half of FWHM width of a Raman scattering peak of a silicon layer formed by another embodiment method, as a function of an energy density of radiated laser.

FIG. 8 shows a half of FWHM of a Raman scattering peak intensity, as a function of the energy density of a laser beam applied to the second-level silicon layer 5. The abscissa represents an energy density in the unit of mJ/cm$^2$ and the ordinate represents a half of FWHM in the unit of cm$^{-1}$. The half of FWHM means a half of the peak width at a half height of the peak. A circle symbol in FIG. 8 indicates a half of FWHM of a silicon layer formed by the second embodiment. A solid circle symbol in FIG. 8 shows a half of FWHM of a silicon layer used as a comparison sample and formed by depositing an amorphous silicon layer of 45 nm thick by a single deposition process and polycrystallizing it by a single laser exposure process while the substrate is heated to 250° C.

A half of FWHM of the silicon layer formed by the second embodiment method is smaller than that of the silicon layer of the comparison sample. This indicates that the silicon layer formed by the second embodiment method has better crystallinity. A reduction amount of the half of FWHM becomes great particularly in the laser beam energy density range of 300 mJ/cm$^2$ or lower.

Figure 9:
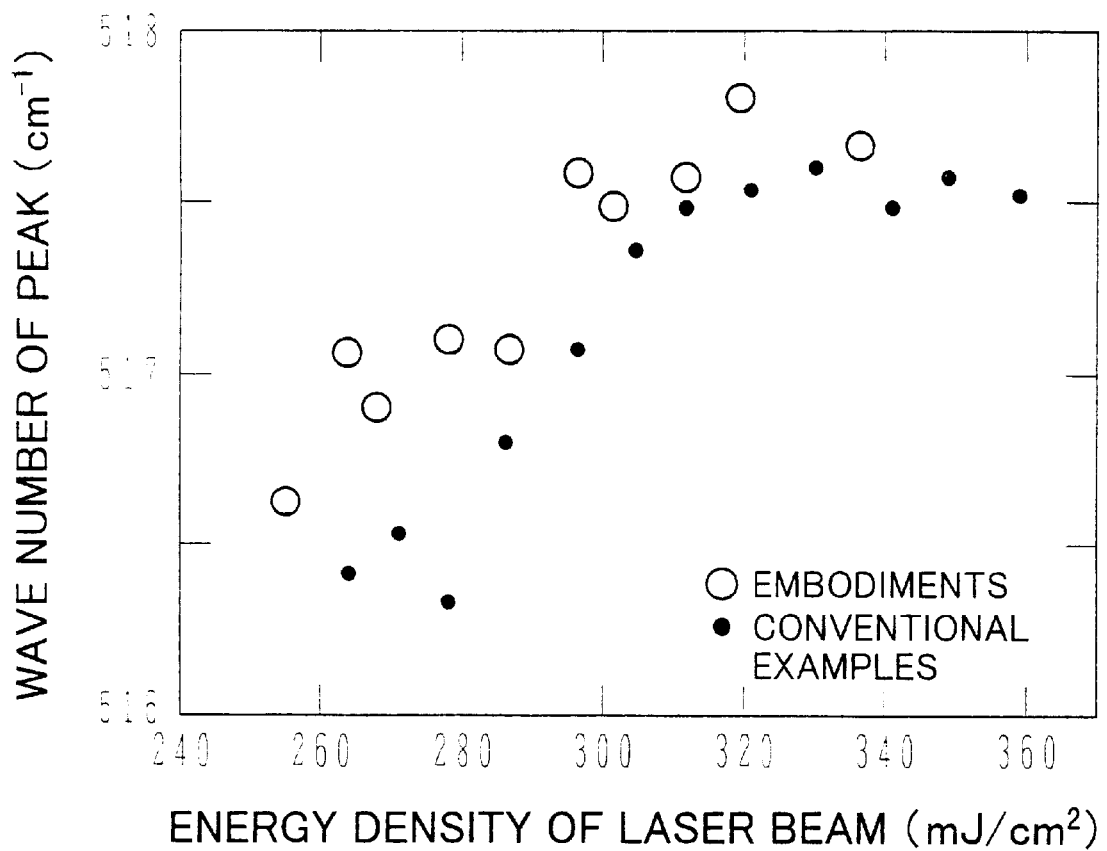
FIG. 9 is a graph showing a wave number corresponding to a Raman scattering peak of a silicon layer formed by the embodiment method, as a function of an energy density of radiated laser.

FIG. 9 shows a wave number corresponding to a signal peak of Raman scattering, as a function of the energy density of a laser beam applied to the second-level silicon layer 5. The abscissa represents an energy density in the unit of mJ/cm$^2$ and the ordinate represents a wave number corresponding to a signal peak in the unit of cm$^{-1}$. A circle symbol and a solid circle symbol shown in FIG. 9 are measured values of the silicon layers formed by the second embodiment method and formed as a comparison sample, similar to FIG. 8. The wave number corresponding to a signal peak of Raman scattering of single crystal silicon is 520.5 cm$^{-1}$.

The silicon layer formed by the second embodiment method has a wave number nearer to the wave number of 520.5 cm$^{-1}$ corresponding to a signal peak of single crystal silicon. This means that the silicon film formed by the second embodiment method has better crystallinity.

Figure 10:
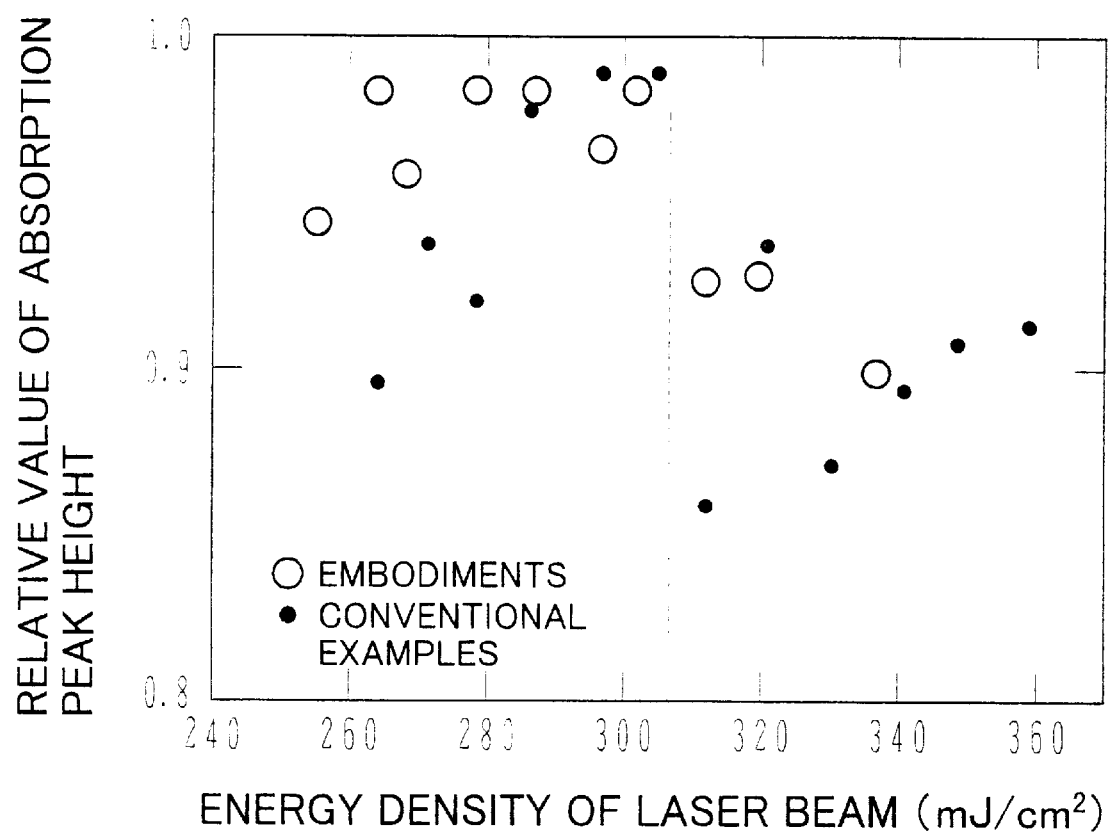
FIG. 10 is a graph showing a relative value of an absorption peak of ultraviolet in a silicon layer formed by the embodiment method, as a function of an energy density of radiated laser.

FIG. 10 shows a relative value of an absorption peak measured with ultraviolet reflection, as a function of the energy density of a laser beam applied to the second-level silicon layer 5. The abscissa represents an energy density in the unit of mJ/cm$^2$ and the ordinate represents a height of an absorption peak as a relative value of the peak of single crystal silicon. A circle symbol and a solid circle symbol shown in FIG. 10 are measured values of the silicon layers formed by the second embodiment method and formed as a comparison sample, similar to FIG. 8.

It is seen from the graph of FIG. 10 that the silicon layer formed by the second embodiment method has an absorption peak height near that of single crystal silicon, which indicates better crystallinity. It is also seen that as the energy density of a laser beam is set to about 305 mJ/cm$^2$, the absorption peak height lowers. Both large and small diameter crystal grains mixed in the silicon layer were found through observations. In contrast, if the laser beam energy density is set to about 305 mJ/cm$^2$, large diameter crystal grains although not so large as obtained at the laser beam energy of above 305 mJ/cm$^2$ were found through observations but fine crystal grains were not found.

The reason of a lower absorption peak height at the laser beam energy density of above 305 mJ/cm$^2$ may be ascribed to the formation of fine crystal grains in the silicon layer. It is therefore preferable to set the energy density to 305 mJ/cm$^2$ or lower when a laser beam is applied to the second-level silicon layer at the substrate temperature of 250° C. As seen from FIG. 10, a silicon layer having good crystallinity can be formed in the energy density range of 280 mJ/cm$^2$ or higher.

Crystal grain diameters were observed with a scanning electron microscope, by secco's etching the surface of silicon layers with a solution of potassium bichromate, hydrofluoric acid and water. The silicon layers were formed by the second embodiment method and by a comparison method which deposits an amorphous silicon layer to a thickness of 45 nm and thereafter performs a single laser exposure process. The energy density of a laser beam used for the second laser exposure of FIG. 1D and that of a laser beam used for the single laser exposure of the comparison method were both set to 297 mJ/cm$^2$.

The crystal grain diameter of the silicon layer formed by the second embodiment method was about 300 nm, whereas that of the silicon layer of the comparison sample was about 100 nm. It is therefore possible to form a polysilicon layer having a large crystal grain diameter by the second embodiment method.

The cross sectional structure of the silicon layer formed by the second embodiment method was observed with a transmission electron microscope. The interface between the first- and second-level silicon layers 3 and 5 shown in FIG. 1D could not be discriminated from this observation. This may be ascribed to re-crystallization of the silicon layers 3 and 5 both melted by the second laser beam exposure of FIG. 1D. This melting is supposed to be imperfect melting leaving crystal growth seeds in the first-level silicon layer 3. The second-level silicon layer 5 is supposed to be perfectly melted because of low melting temperature of amorphous Si. The seeds left in the first-level silicon layer 3 enhance the crystal growth and form large diameter crystal grains.

It is therefore preferable to adjust the substrate temperature and the laser beam energy density at the process of FIG. 1D so that the silicon layer 3 is melted imperfectly and the silicon layer 5 is melted perfectly.

If the crystal growth seeds not melted distribute at a proper density, a good quality polysilicon layer can be expected. Crystallinity which is degraded when the energy density at the second laser beam exposure process is set too high, as shown in FIG. 10, may possibly result from perfect melting of both the silicon layers 3 and 5.

The silicon layer formed by the comparison method is in an amorphous state over the whole thickness thereof before a laser beam is applied. Therefore, crystal growth seeds are not left even under imperfect melting. The comparison method is therefore considered to be difficult to obtain a good polysilicon layer, as compared to the second embodiment method.

Figure 11A:
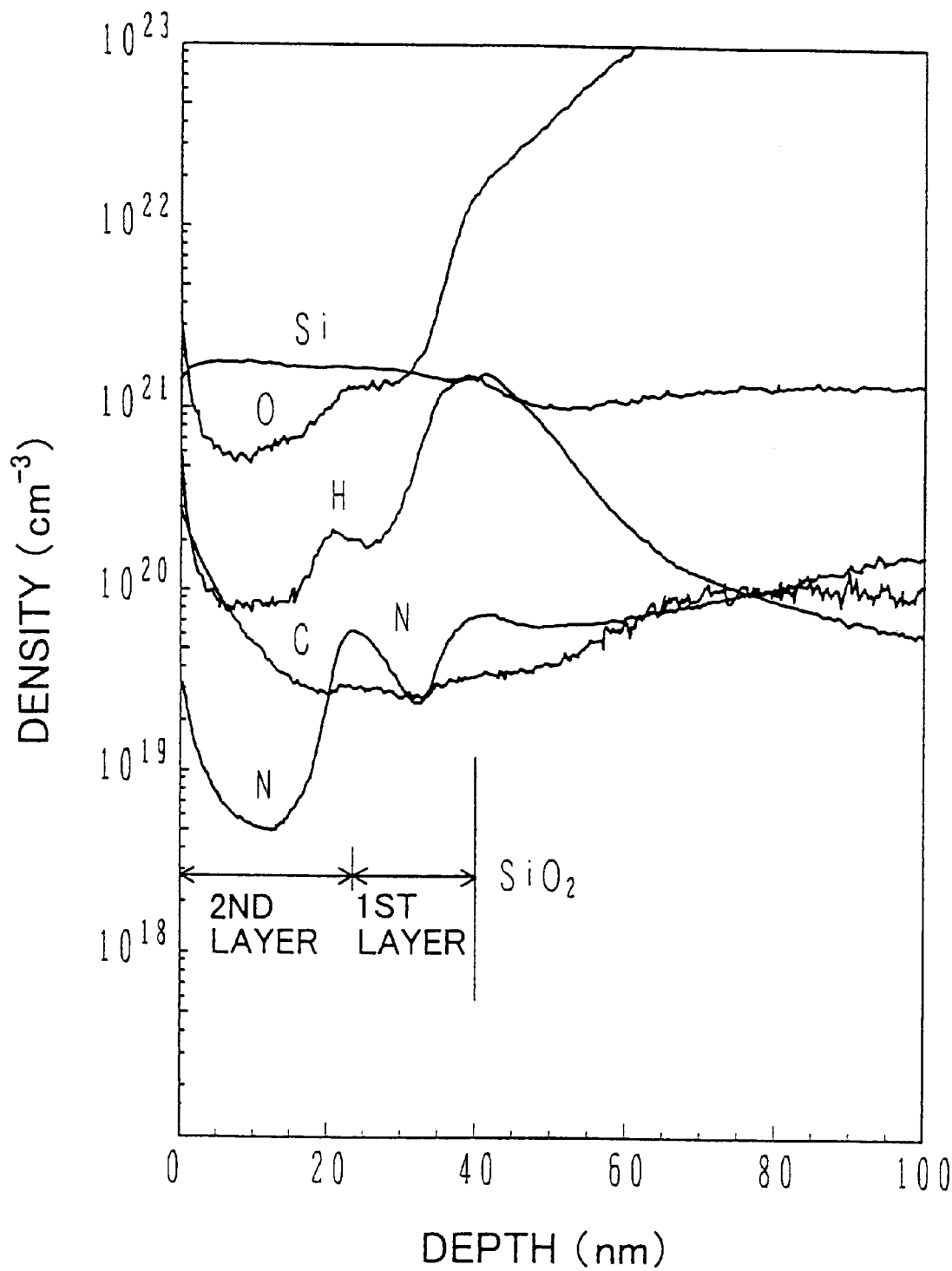
FIGS. 11A and 11B are graphs showing the SIMS analysis results of a polysilicon layer along a thickness direction formed by the embodiment method.
Figure 11B:
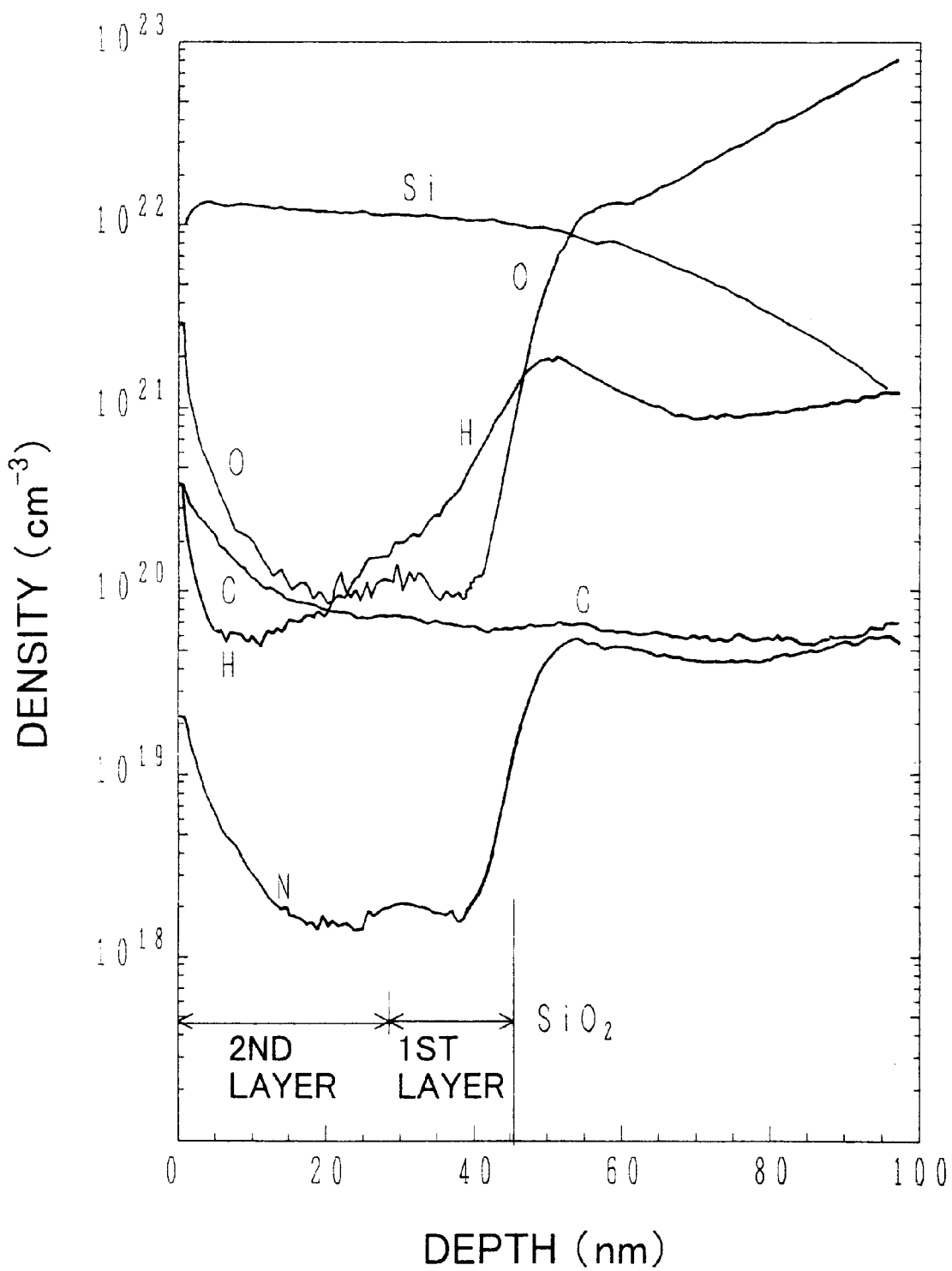

FIGS. 11A and 11B show the SIMS analysis results of two samples having the silicon layers 3 and 5 formed by the second embodiment method. The abscissa of each figure represents a depth from the surface of the silicon layer 5 in the unit of nm and the ordinate of each figure represents a detected density in the unit of $cm^{-3}$. The thicknesses of the first- and second-level silicon layers 3 and 5 are about 20 nm and 30 nm, respectively.

The densities of O, H and N become high near at the interface of the first- and second-level silicon layers 3 and 5. This may be ascribed to the attachment of these elements to the surface of the first-level silicon layer 3 when this layer is exposed to atmospheric air for laser crystalization after it is deposited. Although it is supposed that the silicon layer 5 is perfectly melted and the silicon layer 3 is imperfectly melted by the laser beam exposure at the process of FIG. 1D, atmospheric air impurity elements do not diffuse sufficiently and stay near at the interface, because of a short melting time.

Figure 12:
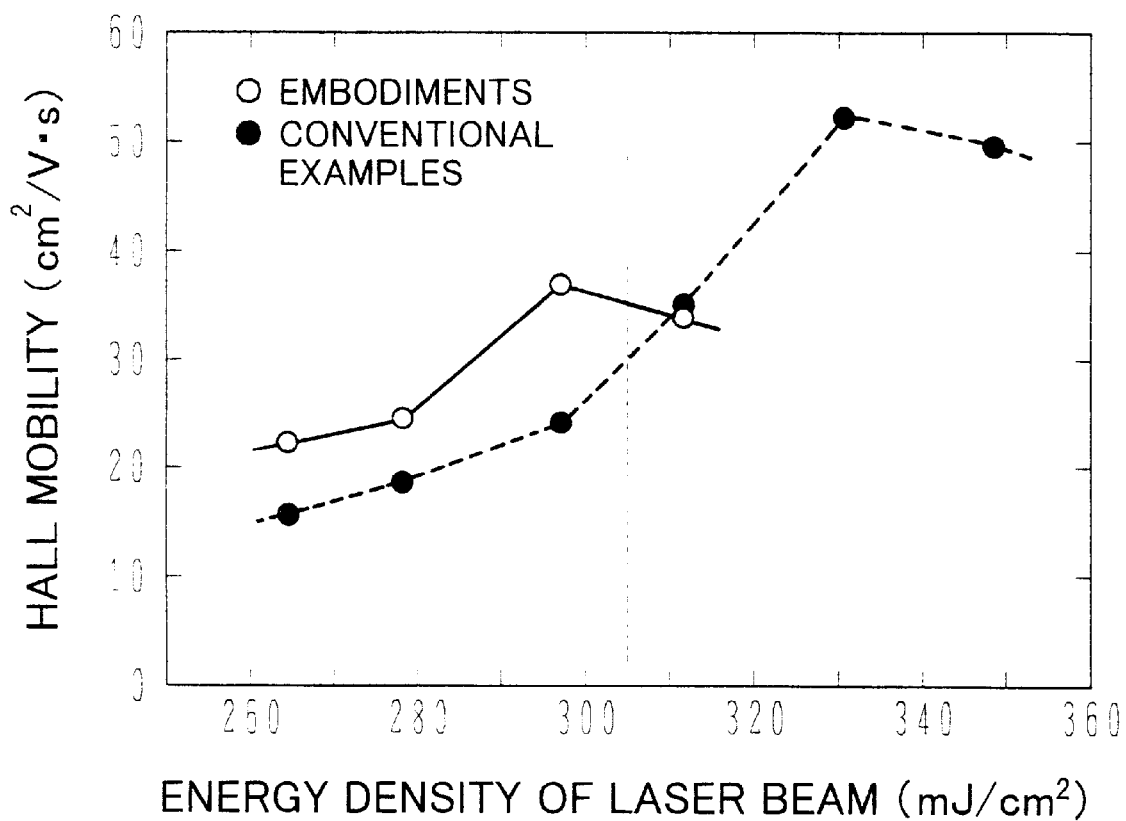
FIG. 12 is a graph showing a Hall mobility of a silicon layer formed by the embodiment method, as a function of an energy density of radiated laser.

FIG. 12 shows a Hall mobility of a silicon layer, as a function of the energy density of a laser beam at the second exposure process. The abscissa represents a laser energy density in the unit of $mJ/cm^2$ and the ordinate represents a Hall mobility in the unit of $cm^2/V \cdot s$. A circle symbol and a solid circle symbol shown in FIG. 12 are measured values of the silicon layers formed by the second embodiment method and formed as a comparison sample, similar to FIG. 8. Measured samples were prepared by ion-doping phosphorous into a silicon layer under the conditions of an acceleration energy of 10 keV and a dose of $6 \times 10^{13}$ $cm^{-2}$, annealing it at 600° C. for 2 minutes, and thereafter inactivating dangling bonds by exposing it to hydrogen plasma for 60 seconds.

The silicon layer formed by the second embodiment shows a higher mobility in a laser beam energy density range of 305 $mJ/cm^2$ or lower. A silicon layer having good electrical characteristics can therefore be obtained by performing a deposition process and a laser exposure process twice.

In an energy density range higher than 305 $mJ/cm^2$, the silicon layer as the comparison sample shows a higher Hall mobility. This may be ascribed, as discussed with FIG. 10, to that large diameter crystal grains and fine crystal grains are mixed in both the embodiment silicon layer and comparison sample silicon layer and the latter layer has larger crystal grains than the former layer.

In the second embodiment, the silicon layer 5 is deposited in an amorphous state at the process of FIG. 1C. This layer may be deposited in a polycrystalline state. Also in this case, if the silicon layer 5 is completely melted at the process of FIG. 1D, advantages similar to the second embodiment are expected.

Next, a method of manufacturing a thin film transistor by using the silicon layer forming method of the first or second embodiment will be described with reference to FIGS. 13A to 13G.

Figure 13A:
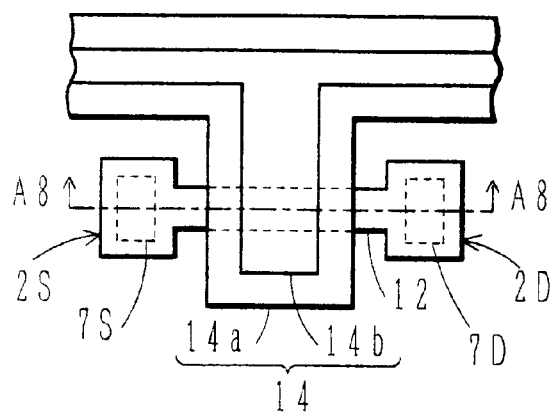
FIG. 13A is a plan view illustrating a method of manufacturing a TFT using a silicon layer formed by one of the first and second embodiment methods.

FIG. 13A shows a schematic plan view of a thin film transistor. A polysilicon film 12 is formed on a glass substrate in a lateral direction. A gate electrode 14 is formed intersecting with the polysilicon film 12 gene rally at the central area thereof in the lateral direction. The gate electrode 14 is formed continuously with a gate wiring line extending in the lateral direction. The gate electrode 14 and gate wiring line are each constituted of a low resistance part 14b made of Al and an anodic oxidation film 14a surrounding the side walls of the low resistance part 14b.

FIGS. 13B to 13G are cross sectional views taken along one-dot chain line A8—A8 of FIG. 13A, illustrating the processes of the TFT manufacture method.

Figure 13B:
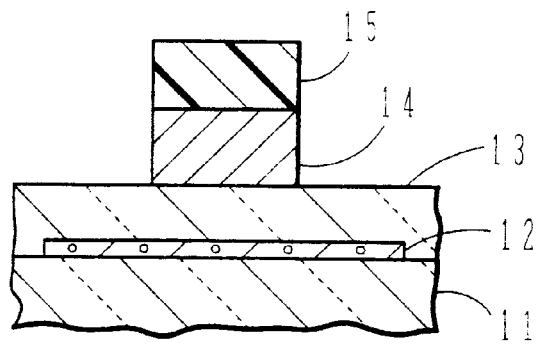
FIGS. 13B to 13G are cross sectional views taken along one-dot chain line A9-A8 of FIG. 13A, illustrating each process of the TFT manufacturing method.

As shown in FIG. 13B, by using the first or second embodiment method, a polysilicon layer is formed about 40 to 50 nm thick on a glass substrate 11, and patterned to form a polysilicon film 12. This patterning is performed, for example, by dry etching using $Cl_2$ containing gas.

A gate insulating film 13 of $SiO_2$ is deposited about 120 nm thick on the whole surface of the substrate 11, covering the polysilicon film 12. Depositing this gate insulating film may be performed, for example, by PE-CVD using $SiH_4$ and $N_2O$.

An Al film is deposited about 350 nm thick on the gate insulating film 13, by sputtering. A resist pattern 15 is formed on the Al film, the resist pattern 15 having the same pattern as the gate electrode 14 intersecting with the polysilicon film 12 shown in FIG. 13A. By using the resist pattern as a mask, the Al film is patterned through dry etching using $Cl_2$ containing gas, leaving a gate electrode 14 in the area covered with the resist pattern 15.

Figure 13C:
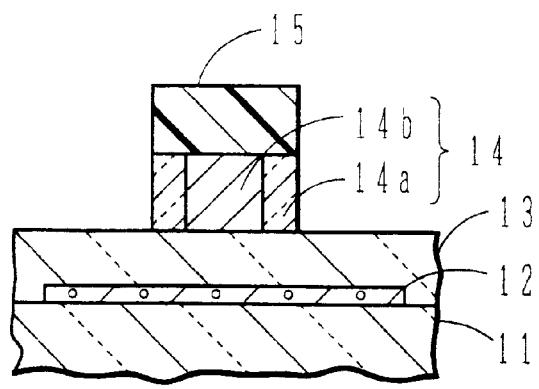

As shown in FIG. 13C, by using the resist pattern 15 as a mask, the exposed surface of the gate electrode 14 is anodically oxidized to leave the low resistance part 14b of Al at the inside of the gate electrode 14 and form the anodic oxidation film 14a on the sidewalls of the low resistance part 14b to a thickness of about 1 to 2 $\mu$m. After the anodic oxidation, the resist pattern 15 is removed.

Figure 13D:
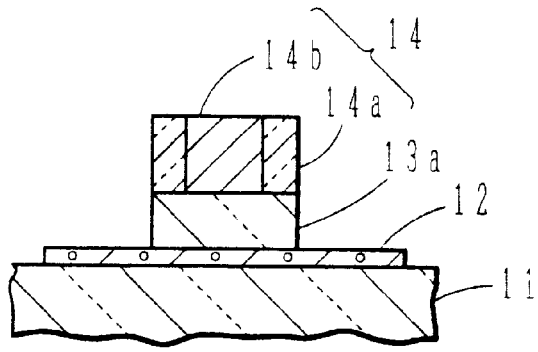

As shown in FIGS. 13D, by using the gate electrode 14 as a mask, the gate insulating film 13 is selectively etched to leave a gate insulating film 13a only just under the gate electrode 14. Etching the gate insulating film is performed, for example, by dry etching using fluorine containing gas. Part of the surface of the polysilicon film 12 is exposed on both sides of the gate insulating film 13a.

Figure 13E:
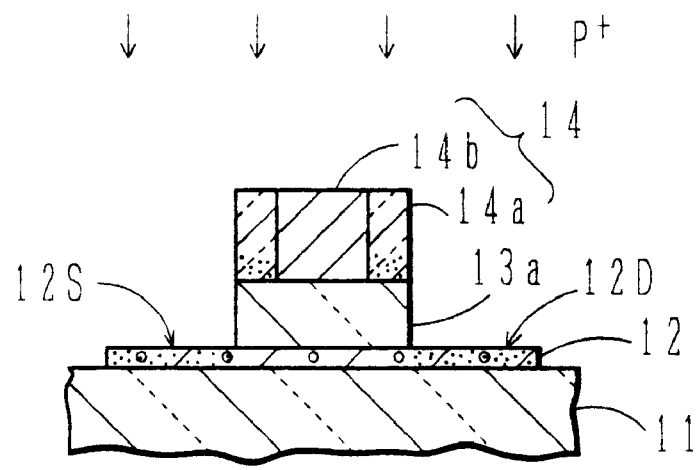

As shown in FIG. 13E, $P^+$ ions are implanted into the substrate over the whole surface thereof, and the substrate is annealed by laser exposure to activate the implanted ions. The dose of $P^+$ ions is set to such a value as the sheet resistance of the ion doped region of the polysilicon film 12 becomes about 1 $k\Omega/\square$. An $n^+$-type source region 12S and an $n^+$ type drain region 12D are therefore formed in the polysilicon film 12 on both exposed sides of the gate insulating film 13a.

With the above processes, the gate electrode 14 is formed which is constituted of the low resistance part 14b of Al and the high resistance parts 14a formed on the side walls of the low resistance part 14b on the source region 12S side and drain region 12D side, respectively.

Figure 13F:
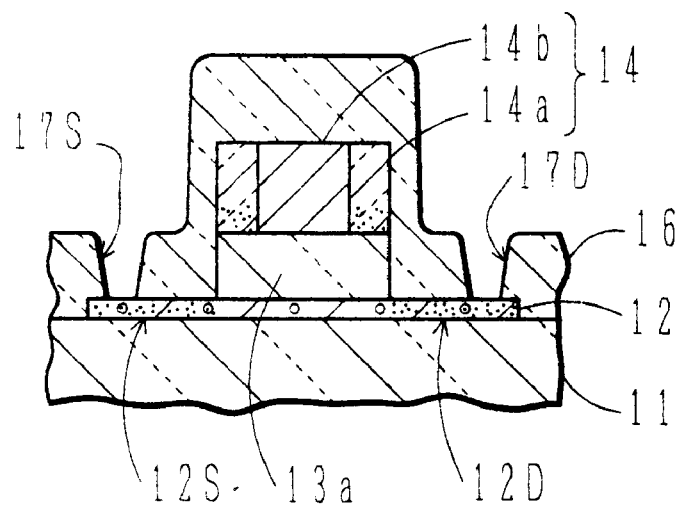

As shown in FIG. 13F, an interlayer insulating film 16 is deposited over the whole surface of the substrate. This interlayer insulating film 16 is made of an $SIO_2$ film about 30 nm thick and an SiN film about 270 nm thick stacked in this order from the bottom. For example, the $SiO_2$ film is deposited by PE-CVD at a growth temperature of 300° C. using $SiH_4$ and $N_2O$ as source gas, and the SiN film is deposited by PE-CVD at a growth temperature of 300° C. using $SiH_4$ and $NH_3$ as source gas.

Contact holes 17S and 17D are formed in the interlayer insulating film 16 to expose partial surface areas of the source region 12S and drain region 12D. For example, the SiN film is dry etched by using fluorine containing gas, and the $SiO_2$ film is wet etched by using buffered hydrofluoric acid which is a mixture of $NH_4F$, HF and $H_2O$.

Figure 13G:
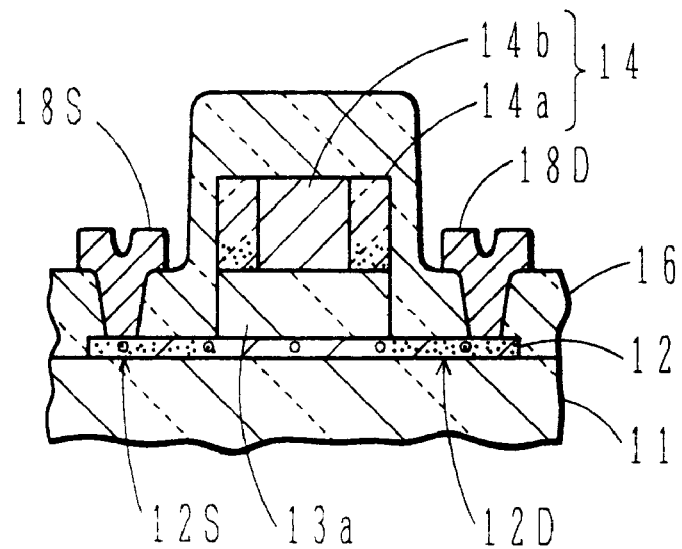

As shown in FIG. 13G, a Ti film about 50 nm thick and an Al film about 300 nm thick are laminated in this order on the whole surface of the substrate. This lamination structure is patterned to form a source contact line 18S connected to the source region 12S and a drain contact line 18D connected to the drain region 12D. For example, the Ti film and Al film are dry etched by using chlorine containing gas.

In the above manner, a thin film transistor can be formed by using the silicon layer forming method of the first or second embodiment. An off-current of this thin film transistor is smaller and the field effect mobility is larger, than a conventional thin film transistor.

If the polysilicon layer 12 is made thinner than 30 nm, it becomes difficult to connect the source region 12S to the source contact line 18S, and the drain region 12D to the drain contact line 18D. If the silicon layer 12 is made thicker than 100 nm, leak current increases. Therefore, it is preferable to set the thickness of the silicon layer 12 to 30 to 100 nm.

Figure 14:
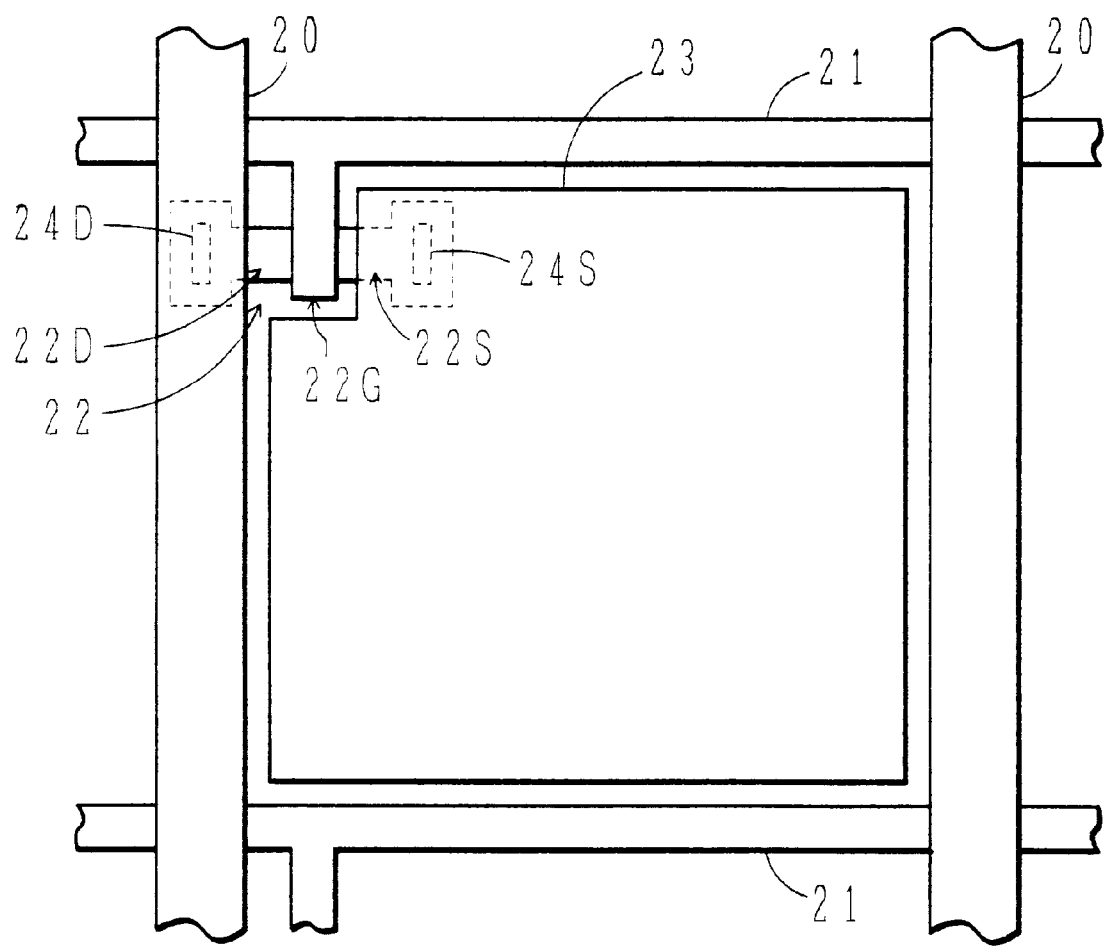
FIG. 14 is a schematic plan view showing one pixel portion of a TFT substrate of a liquid crystal display.

FIG. 14 is a schematic plan view of one pixel area of a TFT substrate of a liquid crystal display wherein TFTs shown in FIG. 13A are used as pixel switching transistors. A plurality of signal lines 20 extending in a vertical direction in FIG. 14 and a plurality of control lines 21 extending in a horizontal direction are disposed in a lattice pattern. The signal line 20 and control line 21 are electrically insulated at their cross point by an interlayer insulating film. A TFT 22 is formed at each cross point of the signal line 20 and control line 21.

A gate electrode 22G of TFT 22 is formed continuously with a corresponding control line 21. A source region 22S of TFT 22 is connected via a contact hole 24S to a transparent pixel electrode 23 formed on the interlayer insulating film covering TFT 22. A drain region 22D is connected via a contact hole 24D formed in the interlayer insulating film to a corresponding signal line 20.

By using TFTs shown in FIG. 13A, an off-current of TFT 22 of the liquid crystal display can be reduced and its display characteristics can be improved.

In the above embodiments, although a polysilicon layer is formed, other polycrystalline semiconductor layers may be formed. For example, the invention is applicable to the formation of polycrystalline layers of Ge, SiGe alloy, and the like.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:

depositing a first layer on a surface of an underlying substrate, the first layer being made of amorphous semiconductor;

polycrystallizing the first layer by applying an energy beam to the first layer;

depositing a second layer on a surface of the polycrystallized first layer, the second layer being made of amorphous semiconductor having the same composition as the first layer; and a total thickness of the first and the second layer is 30 nm to 100 nm:

changing crystallinity of the second layer by applying an energy beam to the second layers;

forming a laminated layer on a partial region of the second layer, the laminated layer including a gate insulating film and a gate electrode on the gate insulating film, a top surface of the second layer being exposed on both sides of the laminated layer; and implanting an impurity into both sides of the laminated layer, and the first and second layers.

2. A method according to claim 1, further comprising the step of performing at least once a step of depositing a third layer on a surface of the second layer after said step of changing the crystallinity of the second layer, the layer comprising an amorphous semiconductor having the same composition as the second layer of polycrystalline semiconductor, and changing the crystallinity of the third layer by applying an energy beam to the third layer.

3. A method according to claim 1, further comprising the step of exposing the surface of the first layer to atmospheric air, after said step of polycrystallizing the first layer and before said step of depositing the second layer.

4. A method according to claim 1, wherein the energy beam is a laser beam.

5. A method according to claim 1, wherein in said step of changing the crystallinity of the second layer, the energy beam is applied to the second layer while the underlying substrate is heated to change the crystallinity of both the first layer and the second layer.

6. A method of manufacturing a semiconductor device comprising the steps of:

depositing a first layer on a surface of an underlying substrate, the first layer being made of amorphous semiconductor;

polycrystallizing the first layer by applying an energy beam to the first layer;

depositing a second layer on a surface of the polycrystallized first layer, the second layer being made of amorphous semiconductor having the same composition as the first layer or polycrystalline semiconductor; and changing crystallinity of the second layer by applying an energy beam to the second layer, wherein in said step of changing crystallinity of the second layer, the energy beam is applied to the second layer while the underlying substrate is heated, to change crystallinity of the first layer and the second layer, and wherein in said step of changing crystallinity of the second layer, a temperature of heating the underlying substrate and an intensity of the energy beam are controlled so that the first layer is melted imperfectly and the second layer is melted perfectly to leave crystal growth seeds in the first layer.

* * * * *